United States Patent [19]

Hirano et al.

[11] 4,079,505
[45] Mar. 21, 1978

[54] METHOD FOR MANUFACTURING A TRANSISTOR

[75] Inventors: Yutaka Hirano, Yokohama; Takayuki Hasegawa, Sagamihara; Minoru Matsumoto, Inagi, all of Japan

[73] Assignee: Fujitsu Limited, Tokyo, Japan

[21] Appl. No.: 650,922

[22] Filed: Jan. 21, 1976

Related U.S. Application Data

[63] Continuation of Ser. No. 451,190, Mar. 14, 1974, abandoned.

[51] Int. Cl.² .............................................. B01J 17/00
[52] U.S. Cl. ...................................... 29/574; 29/589; 29/593
[58] Field of Search ................. 29/574, 589, 590, 591, 29/593

[56] References Cited

U.S. PATENT DOCUMENTS

| 3,465,427 | 9/1969 | Barson | 29/589 |
| 3,676,229 | 7/1972 | Einthoven | 29/574 |
| 3,698,077 | 10/1972 | Dahlberg | 29/589 |

Primary Examiner—W. Tupman
Attorney, Agent, or Firm—Nelson E. Kimmelman

[57] ABSTRACT

Method of manufacturing a transistor which includes an emitter pattern and a base pattern and provides a predetermined current amplification factor, and said method includes a step of measuring a current amplification factor of a monitor transistor during the manufacturing process, the characteristic feature of said method includes the steps of forming a monitor transistor pattern providing the same amplification factor as the semi-conductor device to be manufactured, providing additional portions to an emitter pattern and a base pattern of said monitor transistor pattern, contacting a probe of the measuring apparatus to said additional portions and effecting the measurement of the amplification factor of the monitor transistor.

3 Claims, 32 Drawing Figures

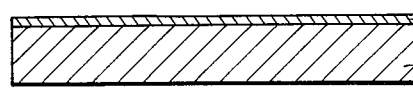
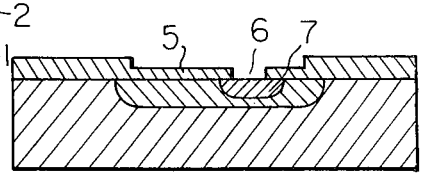
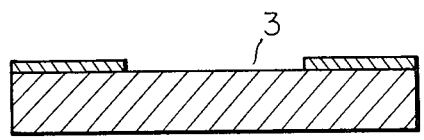
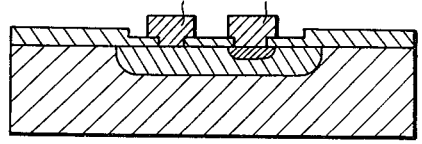
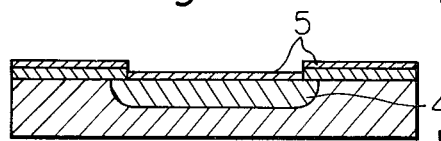
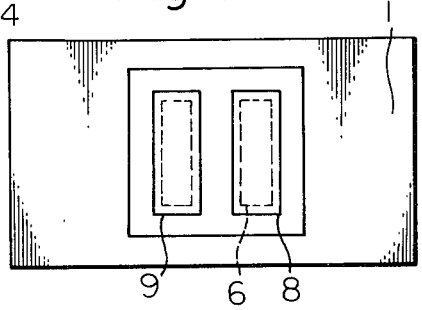
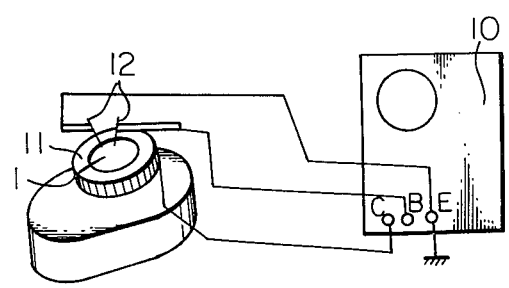

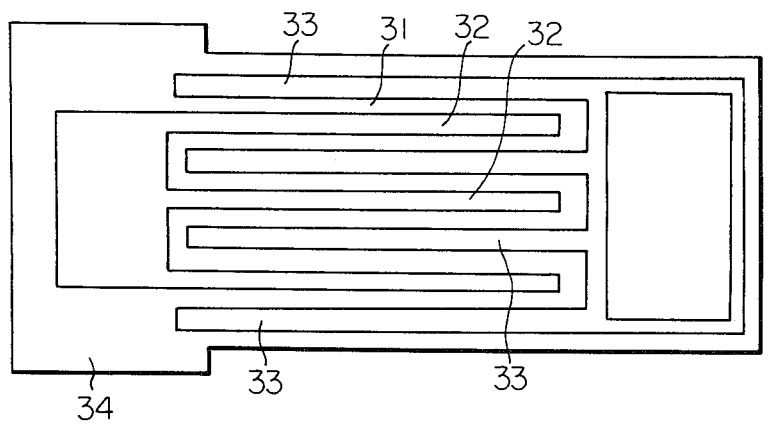
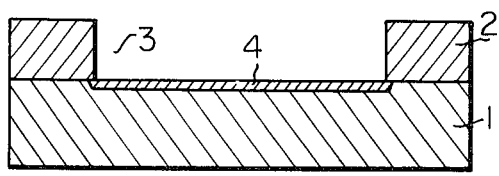
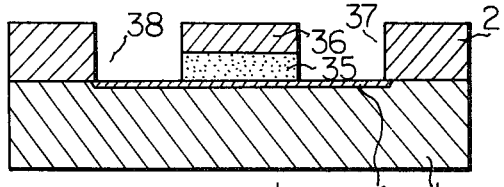
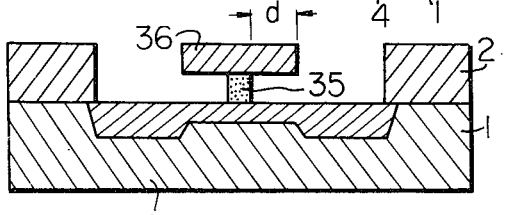
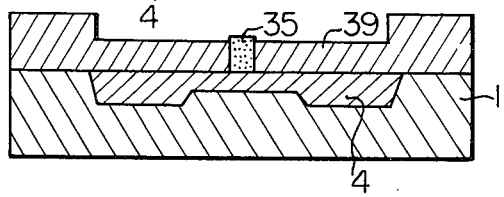

METHOD FOR MANUFACTURING A TRANSISTOR

This is a continuation application of Ser. No. 451,190, filed Mar. 14, 1974, now abandoned.

The present invention relates to a method for manufacturing a transistor, more especially, to a method for measuring the direct current characteristics of a semiconductor device during its manufacturing process, so that based on the results of the measurement the characteristics of the transistor can be predetermined prior to completion of the manufacturing process.

In the manufacture of a semi-conductor device, the direct current characteristics of the semi-conductor device greatly depend on the condition of the emitter diffusion process. Among the direct current characteristics the direct current amplification factor is one of the most important figures of merit of the transistor. If a semi-conductor device of inferior quality is sent from the emitter diffusion process to a process for forming electrodes, a considerable amount of time and work is wasted due to the long process required for forming the electrodes. To prevent such loss it is necessary that the direct current characteristics of the transistor be measured before the electrode forming process. As direct measurement of these characteristics is difficult, a monitor transistor pattern with easily measurable direct current characteristics is formed in the same wafer at the time the transistor is manufactured. However, measurement of the direct current characteristics of transistors used in the ultra high frequency region is difficult to accomplish using such a monitor transistor pattern, because such transistors require a very narrow emitter width and a very limited base-collector junction area while the monitor transistor pattern cannot be too small. That is, if the width of the transistor to be manufactured is smaller than 1 $\mu$, the direct current characteristics of the monitor pattern transistor does not coincide with that of the transistor to be measured. This phenomenon is due to the fact that the depth of the junction formed by the emitter region which is made by a diffusion of conductivity type modifying impurities in the base region depends on the width of the emitter region.

An object of the present invention is to provide a method which overcomes the above-mentioned drawback.

Another object of the present invention is to provide a method wherein the direct current characteristics of the monitor transistor precisely coincide with that of the transistor to be manufactured and further, that contact of the probe with the monitor transistor pattern becomes very easy.

According to the present invention, there is presented a method for manufacturing a semi-conductor device including an emitter pattern and a base pattern and having a predetermined current amplification factor and said method includes a step of measuring a current amplification factor of a monitor transistor during the manufacturing process, and the characteristic feature of said method includes the steps of forming additional portions to an emitter pattern and a base pattern of a monitor transistor pattern and contacting a probe to said additional portions, and measuring the current amplification factor of said monitor transistor.

Further features and advantages of the present invention will be apparent from the ensuing description, with reference to the accompanying drawings to which, however, the scope of the invention is in no way limited.

FIGS. 1A through 1F are diagrams showing a process of manufacturing a silicon planar transistor;

FIG. 2 shows the construction of an apparatus for measuring the direct current characteristics of a transistor;

FIGS. 8A through 8E are diagrams showing the first embodiment of the process of manufacturing the semiconductor device according to the present invention;

Figure 3A:
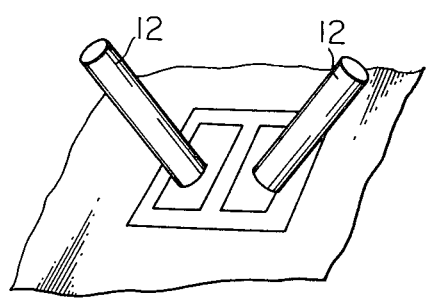
FIG. 3A is an enlarged view of a surface of a transistor.

Firstly, we will outline a process for manufacturing a silicon epitaxial planar transistor. FIGS. 1A through 1F show variations of a section of a silicon wafer during the process of manufacturing the silicon epitaxial planar transistor. The step shown in FIG. 1A is called an initial oxidization and insulation film 2, wherein the film 2, composed of for example silicon dioxide, is formed on the entire surface of the silicon epitaxial wafer 1 after any wellknown surface cleaning process. In the silicon epitaxial wafer, the first conductivity type epitaxial layer (not shown in the figure) having relatively high specific resistance is formed on the first conductivity type silicon substrate having relatively low resistance. A base diffusion window 3 is formed by the conventional photoetching process on a portion of the insulation film 2 as shown in FIG. 1B. Next, a base diffusion layer 4 is formed under the base diffusion window 3 as shown in FIG. 1C. The diffusion layer 4 is usually formed by the well-known two step diffusion method which brings accurate distribution of impurities. This method is composed of the steps of diffusing the conductivity type modifying impurities with relatively high density, so called "deposition" (in this case, the impurities diffuse only into a relatively shallow region of the semiconductor substrate) and redistributing the impurities by a heat treatment at high temperature in an oxidizing atmosphere (this is called "drive in" or "running").

In the heat treatment at high temperature, the impurities of second conductivity types which are of opposite polarity to the first type are redistributed in the substrate and, at the same time, the base diffusion window 3 is covered by a silicon dioxide film 5 which is newly formed. The base region is formed in the epitaxial layer. An emitter diffusion window 6 is formed on a portion of the silicon dioxide film 5 in FIG. 1D by a conventional photoetching process and, next, an emitter layer 7 is formed by diffusion of first conductivity type impurities, usually by a two step diffusion method as mentioned above. Next windows for inserting a base electrode and an emitter electrode are formed by a photoetching process, and the emitter electrode 8 and the base electrode 9 are formed as shown in FIG. 1E. FIG. 1F shows a plan view of the silicon wafer shown in FIG. 1E.

In the above-mentioned process for manufacturing the silicon epitaxial planar transistor, the direct current characteristics, especially the direct current amplification factor of the transistor, greatly depend on the conditions of the emitter diffusion mentioned above, and a long process is required for forming the electrodes. The direct current amplification factor is one of the figures of merit of the function of the transistors. The quality of the transistor is estimated by the above-mentioned direct current amplification factor. When a transistor of inferior quality is sent from the diffusion process to the process of attaching the electrodes a considerable amount of time and work is wasted.

For the purpose of preventing the above-mentioned waste, the direct current characteristics of a transistor are measured before the electrode process by the apparatus as shown in FIG. 2. A measuring apparatus 10, for example, a curve tracer, is connected electrically, to a collector via a fixer 11 of the silicon wafer 1, and is connected electrically to the emitter and the base via fine wires 12, for example, gold wires. The fine wires 12 are directly connected to the silicon on the portions where the silicon dioxide is removed.

FIG. 3A shows an enlarged portion of the transistor shown in FIG. 2 where the fine wires 12 are attached.

In ultra high frequency transistors, it is required that the width of the emitter be limited and that the junction area between the emitter and the collector be small.

These requirements are necessary in order to keep the capacitance between the base and the collector small and raise the transit frequency ($f_T$) which is another important figure of merit of high frequency transistors.

With respect to the fine wires 12, the diameters of said wires are usually between 20 $\mu$ and 50 $\mu$, as wires having a smaller diameter than this are very difficult to use. When the width of the emitter is smaller than 10 $\mu$, it is impossible for such wires having a small diameter to make direct contact with the emitter diffusion layer and the collector diffusion layer on the silicon substrate. Therefore, when ultra high frequency transistors are manufactured, a monitor transistor pattern which is different from the transistor to be manufactured is formed on the same silicon wafer. The monitor transistor pattern is formed so as to allow measurement of the direct current characteristics by probes.

Figure 3B:
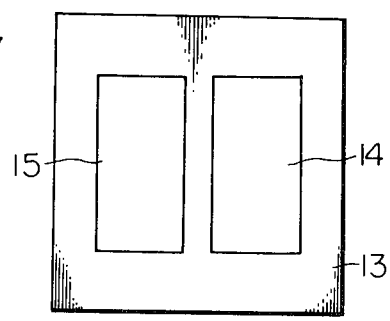
FIG. 3B is a pattern on the surface of a conventional monitor transistor.

FIG. 3B is one example of a monitor transistor pattern for measuring the direct current amplification factor according to the prior art. The monitor transistor pattern shown in FIG. 3B is composed of a base diffusion region 13, an emitter diffusion region 14 and a window 15 for contacting the base region. In the monitor transistor pattern shown in FIG. 3B, the junction area (indicated by the outer lines forming a square) between the base and the collector (not shown in that FIG.) is 100 $\mu$ × 100 $\mu$, the junction area between the emitter and the base is 30 $\mu$ × 60 $\mu$, the window 15 has the dimensions 30 $\mu$ × 60 $\mu$ and the oxide film on the emitter diffusion region is removed.

Figure 4:
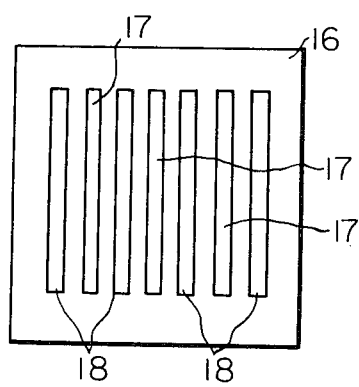
FIG. 4 is a pattern on the surface of the ultra high frequency transistor manufactured by a prior art process.

FIG. 4 is a pattern of an ultra high frequency transistor manufactured by a prior art process. Said pattern shown in FIG. 4 is composed of base diffusion regions 16, emitter diffusion regions 17 and windows 18 for contacting the base region. The width of the emitters of the pattern shown in FIG. 4 is very narrow, for example, 1 $\mu$ to 2 $\mu$.

When the direct current characteristics of the monitor transistor having the pattern shown in FIG. 3B coincides with that of a transistor to be manufactured which has the pattern shown in FIG. 4, the direct current characteristics of the transistor to be manufactured can be estimated by measuring that of the monitor transistor. However, when the width of the transistor to be manufactured becomes smaller than 1 $\mu$, its direct current characteristics, especially, the direct current amplification factor and the inverse voltage between the emitter and the collector, do not coincide with those of the monitor transistor. For example, when the width of the emitter of the transistor shown in FIG. 4 is 0.5 $\mu$, the direct current amplification factor, $h_{FE}$ of the emitter grounded connection is about 80, however, in the monitor pattern shown in FIG. 3B, the value of $h_{FE}$ becomes 300 – 400 or the junction between the collector and the base is broken by the emitter layer piercing the base-collector junction, or a short circuit between the collector and emitter is formed by the punch through phenomenon in the operation of the transistor.

The above-mentioned phenomenon is due to the fact that the depth of the junction formed by the diffusion depends on the width of the emitter. When an emitter having a width of 0.5 $\mu$ and another emitter having a width of 10 $\mu$ are simultaneously diffused on the same silicon wafer, the depth of the junction of the emitter having the 0.5 $\mu$ width is 50 – 70% less than that of the emitter having the 10 $\mu$ width.

Figure 5:
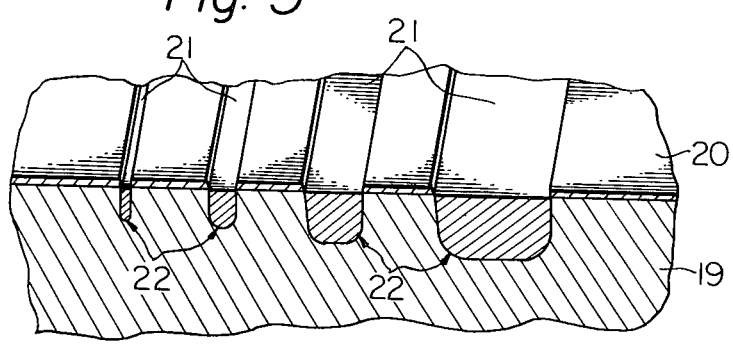
FIG. 5 is a diagram showing the fact that the depth of a junction depends on the width of the emitter.

FIG. 5 shows a diagram explaining one example of experimental results showing the above-mentioned relation. Referring to FIG. 5, a thermal-oxidation film 20 is formed on the N type silicon epitaxial wafer 19 and long and slender windows 21 are formed on the thermal oxidation film 20. Different widths from 0.5 $\mu$ to 10 $\mu$ are prepared for the windows 21. When P type impurities are diffused via the windows 21 into the N type base plate, the P-N junctions 22 are formed as shown in FIG. 5. FIG. 5 is a perspective view when the section is obliquely abraded. As shown in FIG. 5, the depths of the P-N junctions vary with the widths of the windows 21.

Generally, the direct current amplification factor of the grounded emitter is as follows:

$$\frac{1}{h_{FE}} \approx \frac{\rho_e W}{\rho_b L_e} + \frac{W^2}{2D_b T_{\text{eff}}} \quad (1)$$

wherein, $\rho_e$ is the specific resistance in the emitter region, $\rho_b$ is the specific resistance in the base region, W is the width of the base, $L_e$ is the diffusion length of the minority carriers in the emitter region, $D_b$ is the diffusion coefficient of the minority carrier in the base region and $T_{\text{eff}}$ is the effective life of the minority carrier in the base region. Therefore, when the width of the emitter is narrow, the emitter base junction is formed in a shallow portion, the width of the base becomes large and the value of $h_{FE}$ becomes small.

Figure 6A:
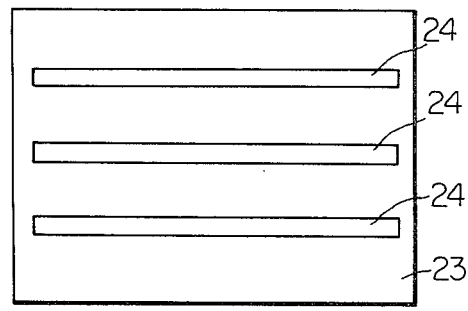
FIG. 6A is a pattern on the surface of the transistor which is manufactured by the method of the present invention.

In the present invention, a monitor transistor is utilized which has direct current characteristics that coincide with the ultra high frequency transistor to be manufactured. FIG. 6A shows a pattern of an ultra high frequency transistor to be manufactured, FIG. 6B shows a pattern of the monitor transistor used in the present invention and FIG. 6C shows a cross section along x-x' of the monitor transistor pattern shown in FIG. 6B.

Referring to FIG. 6A, the pattern of the transistor to be manufactured is composed of a base region 23 and emitter regions 24. Referring to FIG. 6B, the monitor pattern according to the present invention is composed of a first base region 25, a second base region 26, and an emitter region which is composed of long and slender regions 27 and a region 28 having a wide area connected to regions 27. The first base region 25 has a depth equal to the base region 23 shown in FIG. 6A. The second base region 26 is provided for attaching a probe to the region 28. The first base region 25 has a portion 32 on the right side in FIG. 6B which allows attaching of a probe to said region 25. Referring to FIG. 6C, the reference numeral 29 shows a collector region, and 30 shows silicon dioxide films which are used as diffusion masks.

The first base region 25 is formed under the same diffusion conditions as the base region 23 shown in FIG. 6A. The second base region 26 is preferably formed before the first base region is formed. And said second base region 26 is formed with a higher concentration and deeper depth than the first base region 25.

Figure 6B:
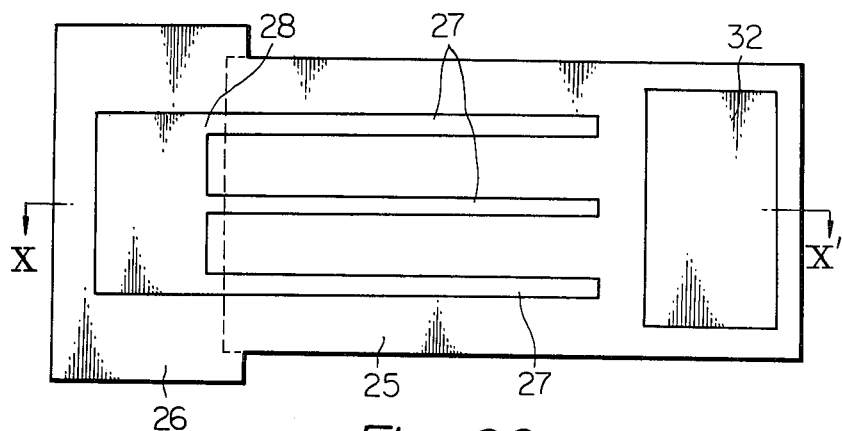
FIG. 6B is a pattern on the surface of a monitor transistor which is used in the present invention.
Figure 6C:
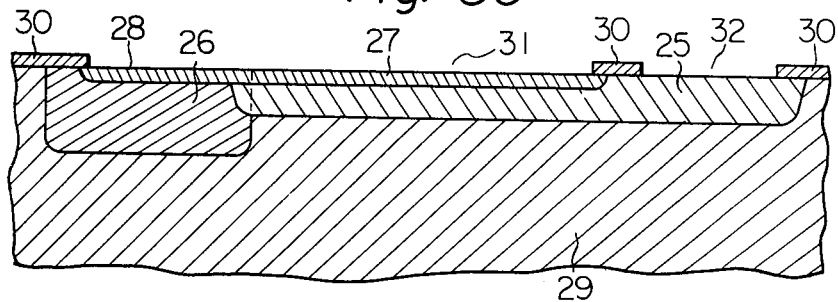
FIG. 6C is a sectional view of the monitor transistor shown in FIG. 6B.

After diffusing the base region, a window for diffusing the emitter patterns 24, and 27 and 28 shown in FIGS. 6A and 6B, respectively, is provided by a photo-etching method. The diffusion for forming the emitter region is carried out by the previously mentioned two step diffusion method. After the emitter region diffusion, the oxide film 30 is thinnest in the area of the emitter pattern. Therefore, the window 31 for contacting the emitter pattern is easily provided by immersing the silicon wafer in an etching fluorate solution over a suitable etching time. This method is called "wash out" method. A window 32 for contacting the base region is provided by photoetching.

The direct current characteristics of the monitor transistor are then measured by the method already described with reference to FIGS. 2 and 3.

By using the monitor transistor pattern shown in FIG. 6A, the value of the direct current amplification factor of the transistor to be manufactured can be the same value as that of the monitor pattern transistor.

As the concentration of the impurities in the second base region 26 is higher than that in the base region 25, the carrier injection efficiency for the second base region 26 is lower than that of the first base region and the width of the base for the second base region 26 is larger than that of the first base region 25. Therefore, the percentage of minority carriers which reach the base-collector junction of the second base region is smaller than that in the first base region. Accordingly, the direct current amplification factor of the monitor transistor mainly depends on the first base region 25, and a good result is obtained with respect to the coincidence of the amplification factor between the monitor transistor and the transistor to be manufactured.

When the measured value of the direct current amplification factor of the monitor pattern transistor does not reach the predetermined value, an additional emitter diffusion is carried out. The above-mentioned monitor transistor can be formed with the transistor to be manufactured or it can be provided with a predetermined number of the monitor transistors in the predetermined positions.

Figure 7:
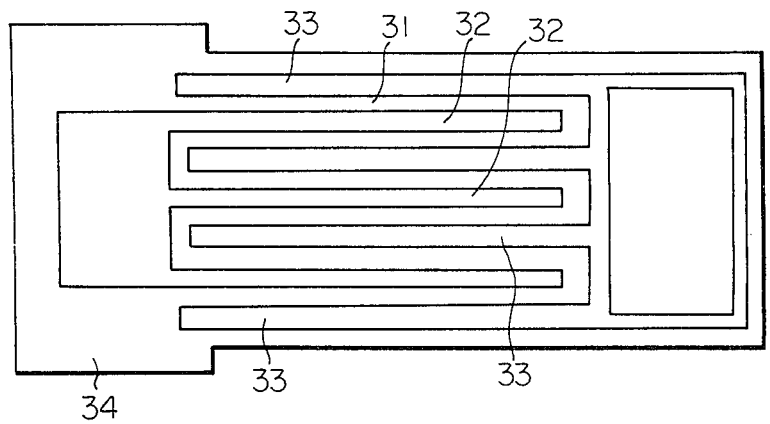
FIG. 7 is a pattern on the surface of another monitor transistor which is used in the present invention.

When the impurity concentration in the first base region 25 is high and a specific resistance in the first base region 25 is low, it is expected that the flow of the base current will be almost uniform. When the concentration of the base impurity in the emitter-base junction is too high, the reverse voltage between emitter-base as well as $h_{FE}$ are decreased. However, when the impurity concentration in the first base region 25 is low, the specific resistance is high and the depth of the first base region becomes shallow, the base current cannot flow uniformly. For preventing this phenomenon, a high impurity concentration layer 33 as shown in FIG. 7, is provided in the first base region 25 adjacent to the emitter region 27. Such high impurity concentration layer 33 is also called a base contact diffusion layer.

In the above-mentioned embodiment, the explanation is presented with respect to the monitor pattern transistor having a stripe form emitter. However, the present invention is applicable to other emitter type transistors by providing a portion where the probe can contact the base pattern or the emitter pattern. Further the method described above can be applied to the manufacture of integrated circuits.

In the above-mentioned method for manufacturing a transistor, it is not always necessary to manufacture the monitor transistor and the transistor to be manufactured on the same semi-conductor wafer. When a plurality of the semi-conductor wafers are manufactured by the manufacturing process and treatment at the same time and the transistors to be manufactured are manufactured from that plurality of semi-conductor wafers, precise monitoring can be still expected. In this case, each wafer is subjected to a process, such as the diffusion process or a process necessary for manufacturing the transistor under the predetermined condition. However, even if the precise condition can be established, repeating exactly the same process is very difficult and dispersion in every process is produced. Therefore, for the purpose of precise monitoring, it is preferable to process every wafer under the predetermined condition.

As is clear from equation (1) above, the direct current amplification factor $h_{FE}$ of the transistor depends on the depths of the emitter diffusion layer and the base diffusion layer and the value of the impurity concentration. Therefore, when the monitor transistor and the transistor to be manufactured are formed on different wafers, the processes of the base diffusion and the emitter diffusion to which they are both subjected are at least carried out in the same diffusion furnace at the same time.

When the monitor transistor and the transistor to be manufactured are manufactured in the same wafer, the base diffusion layer and the emitter diffusion layer of all transistors included in the same wafer are formed under the same diffusion process, except for the additional base region attached only to the monitor transistor.

When the same diffusion processes are carried out on a plurality of the wafers, a profile of the impurity concentration which is diffused in every wafer disperses to some extent. However, the dispersion in the different wafers can be prevented and precise monitoring can be maintained by manufacturing the monitor transistor and the transistor to be manufactured in the same wafer.

Therefore, for the purpose of realizing precise monitoring, it is preferable to provide the monitor transistor and the transistor to be manufactured in the same wafer.

Next, two examples of forming the monitor pattern transistor according to the present invention will be explained.

EXAMPLE 1

FIGS. 8A – 8E show an example of forming the monitor pattern transistor. The patterns of the transistor to be manufactured are shown on the right side of the pattern of the monitor transistor. This example is applicable to the transistor having an emitter with a width of about 1 $\mu$.

Step 1 (FIG. 8A) - Base contact deposition layer 33 is formed on the silicon wafer. $N_2$ gas including a predetermined quantity of Boron tribromide B $Br_3$ is introduced on the silicon wafer for about eleven minutes at a temperature 1050° C and the high density impurity of Boron layer 33 is selectively formed on the silicon wafer by using the diffusion mask of silicon dioxide film where the diffusion window is formed. Sheet resistance after deposition ($\rho_s D$) becomes 12 $\Omega/\square$ at the surface of deposition layer 33. At the same time this base contact diffusion is also carried out on the transistor to be manufactured.

Step 2 (FIG. 8B) - Inert base region 26 is formed only on the monitor transistor. This inert base region corresponds to the additional base region 26 shown in FIG. 6B. In this step, $N_2$ gas including a predetermined quantity of Boron tribromide B $Br_3$ is introduced on the silicon wafer for about eleven minutes at a temperature of 850° C and an inert base region 26 is formed on the silicon wafer. Sheet resistance after deposition ($\pi_s D$) is about 800 $\Omega/\square$ at the surface of the inert base region 26. The depth of the inert base region is 2000 A.

Step 3 (FIG. 8C) - Active base regions are formed on the monitor transistor and also on the transistor to be manufactured. These active base regions correspond to the base region 25 shown in FIG. 6B. In this step, the deposition is carried out for about eleven minutes at a temperature of 790° C. Sheet resistance after deposition is about 800 $\Omega/\square$ at the surface of the region 25. After the deposition of the active base region, the running process is effected for about thirty minutes at a temperature of 950° C. By the running step, the base diffusion region penetrates further. Sheet resistance after running is 1900 $\Omega/\square$ at the surface of the inert base region 26 and the active base region 25. The depth of the junction surface is 1800 A.

Step 4 (FIG. 8D) - The emitter regions are formed on the monitor transistor and the transistor to be manufactured. In this step, after providing diffusion windows, the silicon wafer is placed in a reaction furnace and heated to a predetermined temperature. Next, a monosilane ($SiH_4$)phosphine ($P_2H_6$)-oxygen ($O_2$)gas mixture is sent to the reaction furnace, and phospho-silicate glass film by a chemical vapour deposition of about 1600 – 1800 A is formed in 150 seconds at a temperature of 500° C. After this, the running is carried out for about 3.5 – 5 seconds at 1200° C.

After this running, phospho-silicate glass film on the emitter region of the monitor transistor is selectively removed, and the window for contacting the probe is formed in the emitter region.

Phospho-silicate glass has a property of being very rapidly etched compared to the silicon dioxide and the above-mentioned window in the emitter region of the monitor transistor can be formed by, firstly, covering with photoresist the entire surface of the wafer except for the portion of the surface of the monitor transistor and, secondly, immersing this wafer in a hydrofluoric acid etching solution.

Step 5 (FIG. 8E) - Window 32 is formed by a photoetching method for contacting the probe of the measuring apparatus with the base region 25, and the direct current characteristics of the monitor transistor are measured.

Step 6 - At this time, phospho-silicate glass is still on the emitter region of the transistor to be manufactured. Based on the measuring results from step 5, a decision is made whether additional emitter diffusion is to be carried out. Normally, the direct current amplification factor $h_{FE}$ of the high frequency transistor is about 80. When the value of $h_{FE}$ of the transistor to be manufactured is judged to be insufficient, additional emitter diffusion is carried out. The additional emitter diffusion is carried out by again placing the wafer into the heating furnace and running it for a short time.

In accordance with the above steps transistors having a desired value of direct current amplification factor $h_{FE}$ can be manufactured.

EXAMPLE 2

When the width of the emitter of the transistor becomes smaller than 1 $\mu$, the direct current amplification factor of the monitor transistor becomes further different from that of the transistor to be manufactured. It is very difficult to form a pattern having a width smaller than about 1 – 2 $\mu$ by using a conventional photoetching method. The transistor with an emitter width smaller than 1 $\mu$ can be manufactured by a $Si_3N_4$ over-etching method.

Before explaining Example 2, we will show the essential process of the $Si_3N_4$ over-etching method by referring to FIGS. 9A through 9D.

Figure 9A:
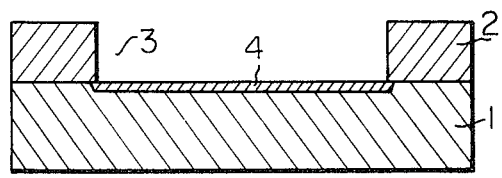
FIGS. 9A through 9D and FIGS. 10A through 10D are diagrams showing the second embodiment of the process of manufacturing the semi-conductor device according to the present invention.
Figure 9B:
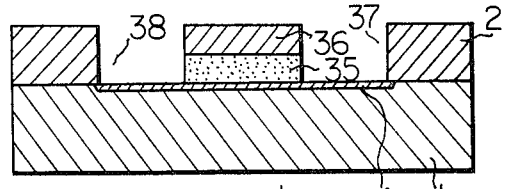
Figure 9C:
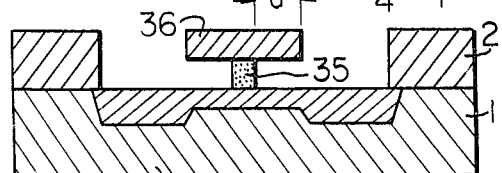
Figure 9D:
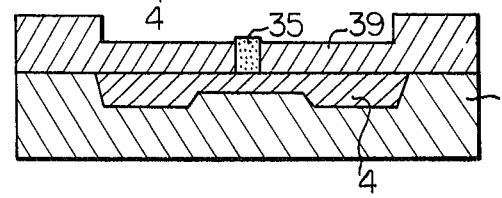

Referring to FIG. 9A, a base region 4 is formed by diffusing the impurities through the window 3 provided on the silicon oxide insulation film 2. Next, a silicon nitride film 35 and a silicon oxide film 36 are deposited on the whole surface of the wafer shown in FIG. 9A and windows 37 and 38 as shown in FIG. 9B are formed by the photo-etching method. On the condition shown in FIG. 9B, a base contact deposition is carried out. After the base contact deposition, an over-etching process shown in FIG. 9C is carried out. In the over-etching process, the silicon nitride film 35 is etched from both sides of the silicon nitride film 35 by boiled phosphate acid. The suitable amount of over-etching d is about 0.5 – 1 $\mu$. As the pattern of the silicon dioxide film 35 is visible through the silicon dioxide film 36, when the silicon nitride film becomes a predetermined width, that is, a predetermined emitter width, the over-etching process can be stopped. Next, the silicon dioxide film 36 can be removed by photo-etching method. Next, silicon oxide film 39 is formed on the surface of the semi-conductor substrate by thermal oxidation in the running process. This condition is shown in FIG. 9D. Next, the silicon nitride film 35 is selectively removed by boiled phosphate acid and the window for diffusing the emitter region is formed in the removed portion.

FIGS. 10A through 10D show an example of forming the monitor pattern transistor. The process of forming the patterns of the transistor to be manufactured is shown on the right side of the patterns of the monitor transistor.

Step 1 (FIG. 10A) - Inert base region 26 is formed only on the monitor transistor. In this step, $N_2$ gas including a predetermined quantity of Boron tribromide $B\ Br_3$ is introduced upon the silicon wafer for about eleven minutes at a temperature of 850° C and an inert base region 26 is formed on the silicon wafer. Sheet resistance after deposition is about 300 $\Omega/\square$. The depth of the inert base region is 2000 A.

Step 2 (FIG. 10B) - Active base regions are formed on the monitor transistor and also on the transistor to be manufactured. These active base regions correspond to the base region 25 shown in FIG. 6B. In this step, the deposition is carried out for about eleven minutes at a temperature of 790° C. Sheet resistance after deposition is about 800 $\Omega/\square$. Next, by conventional chemical vapor deposition, the silicon nitride ($Si_3N_4$) film 35 having a thickness of 1400 – 1900 A is deposited upon a surface of the wafer at a temperature of 800° C over a period of about twelve minutes and then the silicon dioxide film ($SiO_2$) 36 having a thickness of 1000 – 1600 A is deposited upon the wafer at a temperature of 340° C over a period of about six minutes.

Figure 10A:
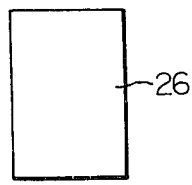
Figure 10B:
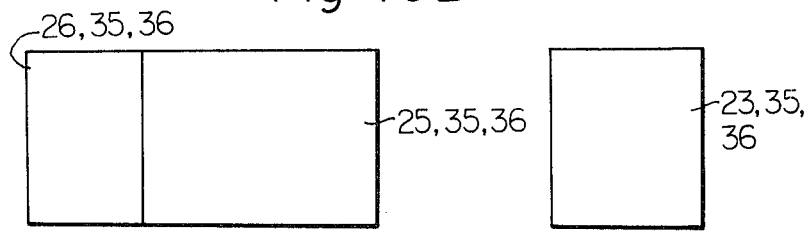
Figure 10C:
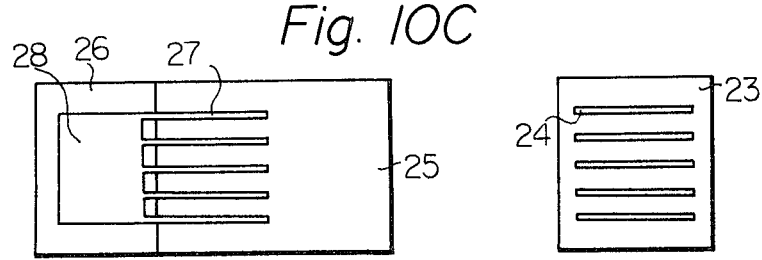
Figure 10D:
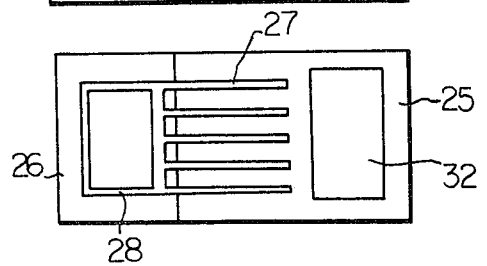

Step 3 (FIG. 10C) - The base contact deposition is carried out via the windows 37, 38 (see FIG. 9B) formed on the wafer shown in FIG. 10B. The base contact deposition is carried out at a temperature of 1030° C over a period of about eleven minutes. The sheet resistance after the deposition is 35 $\Omega/\square$. After the base contact deposition, an over-etching process shown in FIG. 9C is carried out. In the over-etching process, a silicon nitride film 35 of 1.5 $\mu$ width is etched on both sides by phosphate acid and the silicon nitride film 35 becomes about 0.6 $\mu$ in width. Next, the silicon oxide film 36 is selectively removed by photoetching method. Next, the wafer is heated in the oxidizing atmosphere and thereby the base running is carried out. At the same time the silicon oxide film 39 is formed on the surface of the semi-conductor substrate. Next, the silicon nitride film 35 is selectively removed by boiled phosphate acid, and thereby the window for diffusing the emitter region is formed in the removed portion, and then the emitter region is formed by a diffusion of impurities into the base regions. This condition is shown in FIG. 10C.

Step 4 (FIG. 10D) - The process of step 4 is carried out as described in step 5 of Example 1.

Step 5 - Based on the results of the measurement of the value of the direct current amplification factor $h_{FE}$ of the monitor transistor, a decision is made whether additional emission diffusion is to be carried out on the transistor to be manufactured. When the $h_{FE}$ of the transistor to be manufactured is too large, said transistor is abondoned, when too small, the additional emitter diffusion is effected on said transistor. Thus, transistors having a desired value of $h_{FE}$ can be manufactured.

Results

Figure 11:
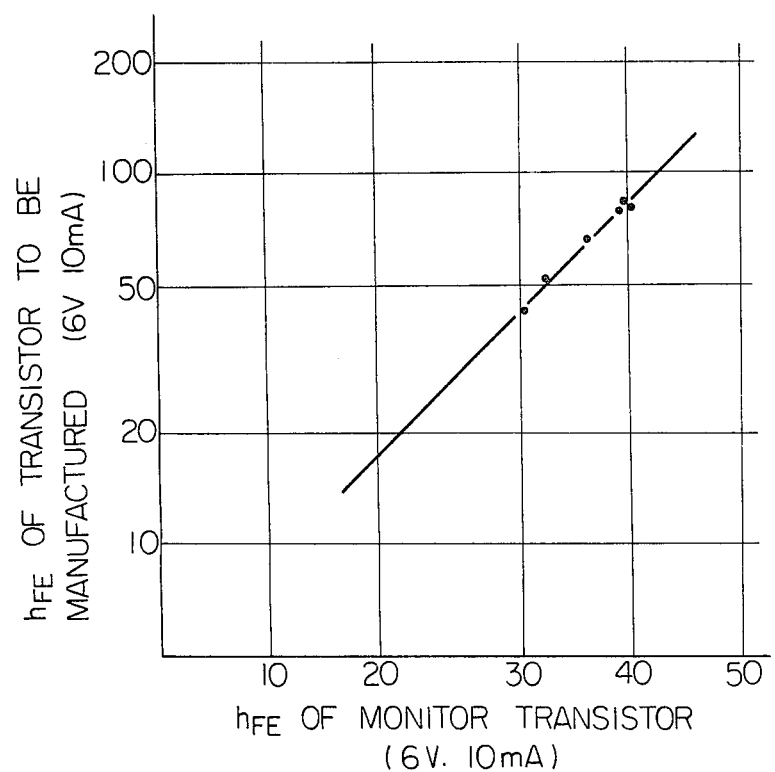
FIG. 11 and FIGS. 12A through 12C are graphs showing the results obtained when the second embodiment, shown in FIGS. 9A through 9D and FIGS. 10A through 10D, was compared to the conventional monitor transistor.

FIG. 11 is a diagram showing the coincidence of the direct current amplification factors of the transistor to be manufactured and the monitor pattern transistor which are formed by the method described in Example 2. The width of the emitter of the above-mentioned monitor transistor and transistor to be manufactured is about 0.6 $\mu$.

Figure 12A:
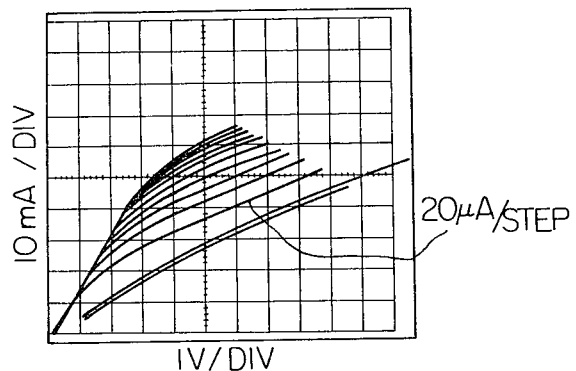
Figure 12B:
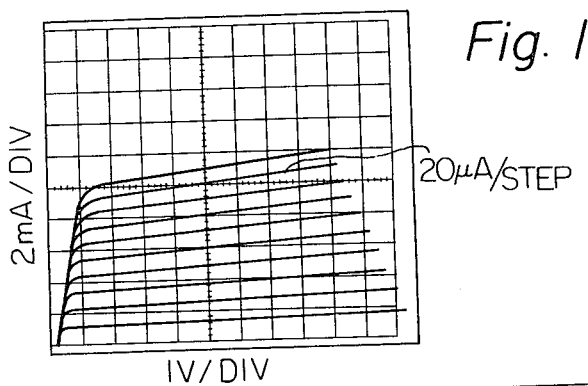
Figure 12C:
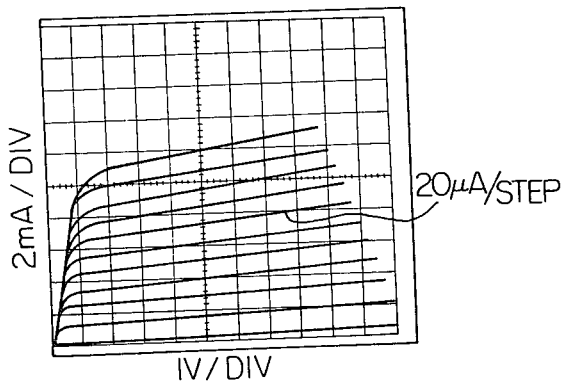

FIGS. 12A through 12C are graphs showing collector characteristics of the conventional monitor transistor, the monitor transistor and the manufactured transistor according to the present invention. In FIGS. 12A through 12C, the vertical axis shows collector current $I_c$, the horizontal axis shows collector voltage $V_c$, a base current $I_b$ is used as a parameter, and transistors are used as an emitter grounded amplifier. The current amplification factor $h_{FE}$ of the transistor is shown by $$h_{FE} = I_c/i_b$$

FIG. 12A concerns a conventional monitor transistor having an emitter size of 15 $\mu \times$ 30 $\mu$. FIG. 12B and FIG. 12C concern a monitor transistor and a manufactured transistor having emitter widths of 0.6 $\mu$.

Usually, the $h_{FE}$ value of the high frequency transistor is estimated as i $V_c = 6\ V$, $I_c = 10$ mA. The $h_{FE}$ value of the transistor which is manufactured is usually about 80.

What is claimed is:

1. In a method of producing a specified transistor having a predetermined very narrow emitter region pattern and a very narrow base region pattern with which it is impossible to make satisfactory contact by test probes of a measuring instrument because the contact regions of said probes are too large relative to the sizes of said emitter and base region patterns, the steps of:
   (a) producing a monitor pattern transistor having essentially the same predetermined very narrow emitter region pattern and very narrow base region pattern as said specified transistor, forming an additional emitter portion and an additional base portion on said monitor transistor, said portions being of a size that enables the contact regions of said test probes to make satisfactory contact therewith and being formed so as not to substantially affect the direct current characteristics of said monitor pattern transistor, the production of said monitor pattern transistor including the step of simultaneously subjecting said monitor pattern transistor and said specified transistor to the same diffusion process,
   (b) bringing the contact regions of said test probes respectively into direct contact with said additional portions of said monitor pattern transistor to measure whether said latter transistor conforms to predetermined direct current specifications,
   (c) continuing the simultaneous diffusion of the emitter regions plus subsequent direct current measuring if the direct current characteristics of said monitor pattern transistor does not conform to said predetermined direct current specifications, and
   (d) then attaching electrodes respectively to the emitter and base regions of said specified transistor after said test instrument indicates that the measured direct current characteristic of said monitor pattern transistor conforms to said predetermined direct current specifications.

2. In the method according to claim 1 wherein in step(a), said monitor pattern transistor and said specified transistor are produced on the same semiconductor substrate.

3. In the method according to claim 1 wherein said additional base and emitter portions of said monitor pattern transistor are respectively connected to said base and emitter regions thereof.

* * * * *